United States Patent
Heid

[19]

[11] Patent Number: 6,154,068
[45] Date of Patent: Nov. 28, 2000

[54] DIGITAL OSCILLATION GENERATOR

[75] Inventor: Oliver Heid, Gunzenhausen, Germany

[73] Assignee: Siemens Aktiengesellschaft, Munich, Germany

[21] Appl. No.: 09/340,521

[22] Filed: Jun. 28, 1999

[30] Foreign Application Priority Data

Jun. 29, 1998 [DE] Germany ............................ 198 28 955

[51] Int. Cl.$^7$ ................................................ H03B 21/00
[52] U.S. Cl. ...................................... 327/106; 331/177 R
[58] Field of Search .................................... 327/105, 106, 327/107; 331/177 R, 182

[56] References Cited

U.S. PATENT DOCUMENTS

| | | | |
|---|---|---|---|
| 4,992,743 | 2/1991 | Sheffer | 328/14 |
| 5,070,254 | 12/1991 | Summers | 327/105 |
| 5,170,123 | 12/1992 | Holland et al. | 324/322 |
| 5,179,348 | 1/1993 | Thompson | 328/14 |
| 5,619,535 | 4/1997 | Alvarez, Jr. | 327/106 |

Primary Examiner—Tuan T. Lam
Assistant Examiner—Linh Nguyen
Attorney, Agent, or Firm—Schiff Hardin & Waite

[57] ABSTRACT

A digital oscillation generator has a first feedback-supplied adder that has an input side connected to a first control input, a second feedback-supplied adder that has an input side connected to a second control input, a further adder that has an input side connected to a third control input and to the respective outputs of the first and second feedback-supplied adder, and a memory that has an input side connected to an output of the further adder and that has a first oscillation output.

10 Claims, 1 Drawing Sheet

DIGITAL OSCILLATION GENERATOR

BACKGROUND OF THE INVENTION

1. Field of the Invention

The present invention is directed to a digital oscillation generator that, in particular, is suitable for employment in a radio-frequency transmitter of a diagnostic magnetic resonance apparatus.

2. Description of the Prior Art

In magnetic resonance imaging, the frequency dependency of the magnetic resonance signals on the magnetic field is utilized for the spatial resolution. Given the imaging sequences that are currently standard, a magnetic field gradient is produced in the imaging region in addition to the main magnetic field such that only nuclei in a specific slice of a subject are excited. For the excitation of the slice, a radio-frequency signal having a corresponding center frequency and bandwidth is transmitted into a region to be imaged. The spatial resolution in the slice ensues by a subsequent phase encoding and, upon reception of the magnetic resonance signals, by a frequency encoding with corresponding magnetic field gradients.

U.S. Pat. No. 5,170,123 discloses a magnetic resonance apparatus with a digital transmitter/receiver. The digital transmitter/receiver has a numerically controlled modulation oscillator (NCMO) whose frequency and phrase can be predetermined with digital control signals that are generated by a sequence controller. A further input is provided for lowering the base frequency. The output of the numerically controlled modulation oscillator is a value with which a sine table in a following memory is addressed. The output signal is then supplied to a modulator in the transmitter and to a demodulator in the receiver.

SUMMARY OF THE INVENTION

An object of the present invention is to provide digital oscillation generator with which the frequency and phase of the signal at the oscillator output can be controlled in a simple way.

The object is achieved in accordance with the invention in a digital oscillation generator having a first feedback-supplied adder that has an input side connected to a first control input, a second feedback-supplied adder that has an input side connected to a second control input, a further adder that has an input side connected to a third control input and to respective outputs of the first and second adders, and a memory that has an input side connected to an output of the further adder and that has a first oscillation output. The frequency and phase of the oscillation generator thus can be arbitrarily set. In particular, the phase coherency at the radio-frequency side that is required for the various imaging sequences can be easily produced in a diagnostic magnetic resonance apparatus. In this context, phase coherency means that the phase has a specific value at a specific time. By dividing the frequency controller into a constant base frequency and a variable auxiliary frequency, a high precision is achieved with a minimum word length of the digital control signals. The angle increment which determines the base frequency at a given clock rate is supplied to the first control input, and the angle increment which determines the variable frequency part at a given clock rate is supplied to the second control input. The zero phase angle can be supplied via the third control input.

In one embodiment the memory has a second oscillation output, with the aforementioned first oscillation output being fashioned as an in-phase output and the second oscillation output being fashioned as a quadrature output. Fundamentally, the in-phase and the quadrature signal can be generated from a single sine or cosine table by simultaneously reading out different memory contents.

In another embodiment, the input side of the further adder is connected to a phase correction memory. Phase errors of the following signal chain thus can already be compensated in a simple way via the digital oscillation generator itself.

In another embodiment, the second feedback-supplied adder has a reset input. Given employment in a magnetic resonance apparatus, the oscillation generator can be reset to the base frequency after every transmission operation.

In another embodiment, at least one of the oscillation outputs is connected to a modulator. The fully digital design of the oscillation generator as transmitter satisfies high demands as to long-term stability.

Amplitude errors that are generated in the elements of the following signal chain can be corrected in a simple way when, according to a further embodiment, the modulator is connected to a magnitude correction memory.

DESCRIPTION OF THE PREFERRED EMBODIMENTS

Figure 1:
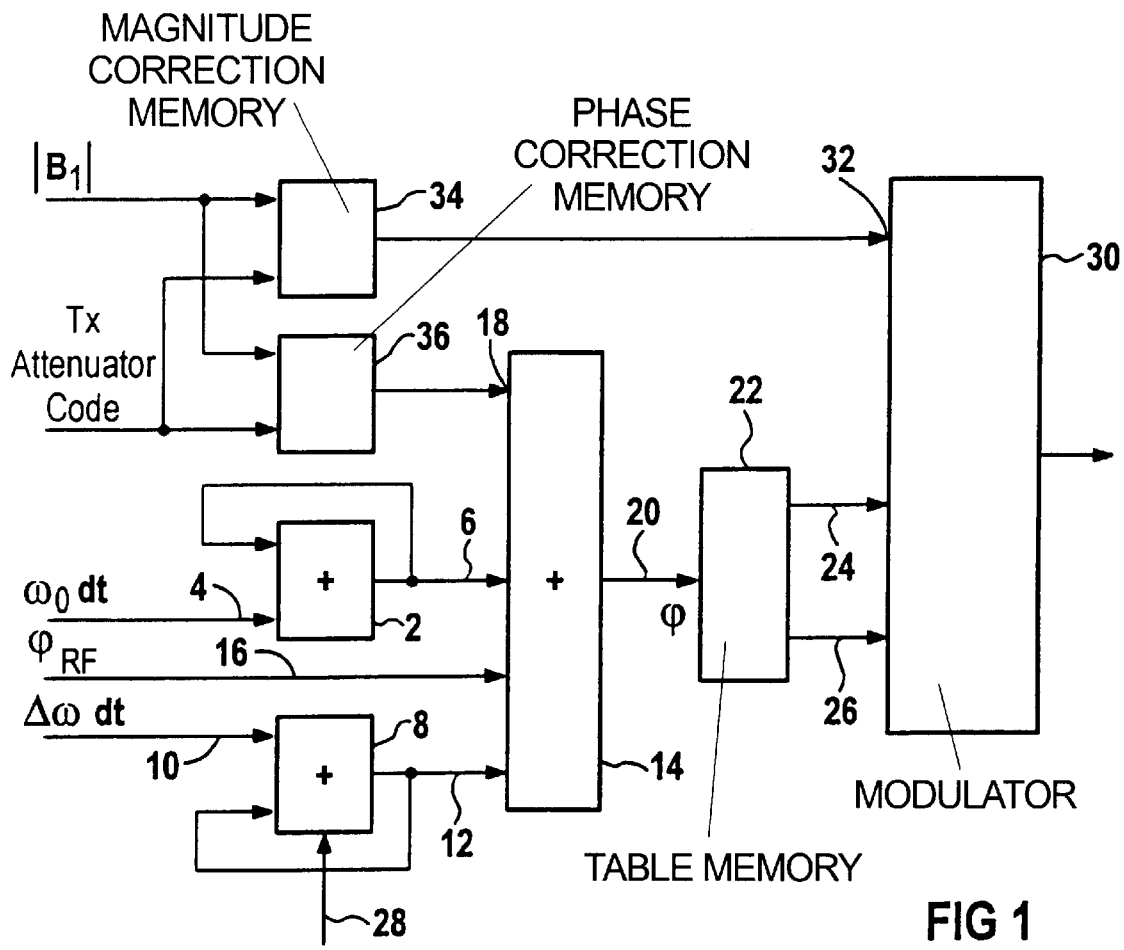
FIG. 1 is a block circuit diagram of a digital oscillation generator.

In the digital oscillation generator shown as a block circuit diagram in FIG. 1, clock generators and clock inputs of the digital modules that are required are not shown for clarity. The oscillation generator can be operated with a clock rate of 10 MHZ with standard components. The digital oscillation generator works according to the principle of a numerically controlled oscillator, whereby an oscillation form memory is addressed dependent on the phase of the oscillation to be generated. The digital oscillation generator can be utilized in a diagnostic magnetic resonance apparatus for generation and modulation of the radio-frequency transmission signals in the MHZ range and for demodulation of the received magnetic resonance signals.

The oscillation generator has a first feedback-supplied adder 2 that has an input side connected to a first control input 4. The adder 2 increments the data value output at the output 6 by the value which is present at the input 4, this incrementation occurring at every clock.

A second feedback-supplied adder 8 has an input side connected to a second control input 10. Just like the first adder 2, the second adder 8 generates a digital value at its output 12, this digital value being incremented after every clock by the value at the second control input 10.

The respective outputs 6 and 12 of the first and second adders 2, 8 are connected to inputs of an adder 14. The adder 14 also has an input side connected to a third control input 16. In addition, the adder 14 has a phase correction input 18.

All digital values at the inputs of the adder 14 are added and the adder 14 emits a phase signal φ at its output 20. The phase signal φ at the output 20 addresses a sine-cosine memory 22 that has an in-phase oscillation output 24 and a quadrature oscillation output 26. The respective word lengths of the control signals and the clock frequency with which the adders 2 and 8, the adder 14 and the memory 22 work, is determined by the demand as to the precision of the oscillation signal.

The second adder 8 also has a reset input 28 via which the output value of the adder 8 can be reset to zero. If zero is then also prescribed simultaneously as the value at the input of the adder 8, then the output value remains an unmodified zero.

The in-phase oscillation output 24 and the quadrature oscillation output 26 are connected to corresponding inputs of a digital single sideband modulator 30; they can also be connected—which is not explained in greater detail—to a demodulator 4, for example, for demodulation of the received magnetic resonance signals. A further input 32 of the single sideband modulator 30 is supplied with a modulation signal with which the in-phase and quadrature oscillations are correspondingly modulated in amplitude. The radio-frequency, modulated single sideband signal is then generated in digital form from the two modulated oscillations (modulated in-phase oscillation and modulated quadrature oscillation).

In addition, two correction memories 34 and 36 are provided for compensating signal distortions in the following signal chain. The first correction memory 34 has an output side connected to the modulator 30, and the second correction memory 36 has an output side connected to the phase correction input 18 of the adder 14. An ideal modulation signal $|B_1|$ and an attenuator code signal TX are supplied as address signals to the two correction memories. Correction values that take the distortions or the tolerable attenuations into consideration and that are previously determined, for example when installing the system, are stored in the two memories 34, 36. The pre-emphasis modulation signal is then supplied by the correction memory 34, serving as a magnitude correction memory. The two memories 34 and 36 are implemented, for example, as FLASH EPROMs or EEPROMs that can be written with new values but that do not lose the memory contents in the absence of power.

The angle increment $\omega_0 dt$ of the base frequency is supplied here to the first control input 4. The angle increment $\omega_0 dt$ generally remains constant over a longer time span. Frequency deviations $\Delta\omega$ from the base frequency are supplied to the second control input 10 as variable angle increment $\Delta\omega dt$. The zero phase angle TURF is supplied to the adder 14 via the third control input. The zero phase angle also generally remains constant over a longer time span. By contrast, phase corrections that correct phase errors produced in the following elements of the signal processing chain such as, for example, in a modulator or in a power amplifier, can be prescribed via the phase correction input 18.

Figure 2:
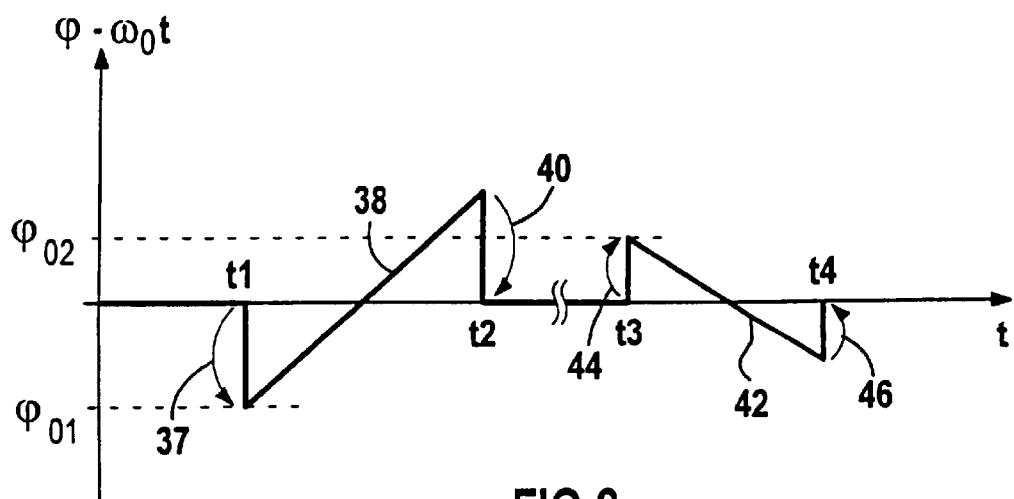
FIG. 2 shows an exemplary signal curve of the phase angle that addresses the signal shape memory in the inventive digital oscillation generator.

FIG. 2 shows the time curve of the phase signal generated at the output of the adder 20, but without the part deriving from the base oscillation $\omega_0$, i.e. the curve of the phase angle $\phi - \omega_0 t$. At time t1, a signal is to be generated that has a zero phase angle of, for example, $\phi_{01}$, symbolized by an arrow 37. The value of the zero phase angle $\phi_{01}$ is supplied to the adder 14 via the input 16. In addition, the frequency is to be raised at this point in time, meaning a linearly rising curve 38 in the phase signal in FIG. 2. As a result of values different from zero at the phase correction input 18, a non-linearly rising curve can also occur. The rising part 38 ends at time t2. At this time t2, the fed back adder 8 is set, for example, to zero via the reset input 28, symbolized by an arrow 40. At time t3, a lower frequency than the base frequency $\omega_0$ is to be generated, this meaning a linearly falling phase value 42. In addition, the phase angle at time t3 should assume the value $\phi_{02}$, which is effected by a corresponding control signal at the third control input 16 and illustrated by an arrow 44. Again, a non-linear curve can occur due to values at the phase correction input 18. At the end t4 of the falling part in the phase curve, the second fed back adder 8 is reset via the reset input 28 (arrow 46).

Although modifications and changes may be suggested by those skilled in the art, it is the intention of the inventor to embody within the patent warranted hereon all changes and modifications as reasonably and properly come within the scope of his contribution to the art.

I claim as my invention:

1. A digital oscillation generator comprising:
   a first feedback-supplied adder having an input connected to a first control input, and having an output;
   a second feedback-supplied adder having an input connected to a second control input, and having an output;
   a further adder having an input connected to a third control input, a first input connected to the output of said first feedback-supplied adder, and a second input connected to the output of said second feedback-supplied adder, and having an output; and
   a memory having an input connected to the output of said further adder and having an output, said memory containing addressable memory contents which produce an oscillation parameter at said output of said memory dependent on the output from said further adder supplied to the input of said memory.

2. A digital oscillation generator as claimed in claim 1 wherein said memory contains a sine-cosine table as said memory contents.

3. A digital oscillation generator as claimed in claim 1 wherein said output of said memory comprises a first oscillation output, and wherein said memory further comprises a second oscillation output, said first oscillation output emitting an in-phase oscillation parameter and said second oscillation output emitting a quadrature oscillation parameter.

4. A digital oscillation generator as claimed in claim 3 further comprising a modulator connected to at least one of said first and second oscillation outputs.

5. A digital oscillation generator as claimed in claim 4 further comprising a magnitude correction memory connected to said modulator.

6. A digital oscillation generator as claimed in claim 3 further comprising a single sideband modulator connected to both of said first and second oscillation outputs.

7. A digital oscillation generator as claimed in claim 6 further comprising a magnitude correction memory connected to said single sideband modulator.

8. A digital oscillation generator as claimed in claim 1 wherein said second feedback-supplied adder has a reset input.

9. A digital oscillation generator as claimed in claim 1 further comprising a phase correction input connected to an input of said further adder.

10. A digital oscillation generator as claimed in claim 9 further comprising a phase correction memory connected to said phase correction input.

* * * * *